United States Patent
Huang et al.

(10) Patent No.: US 10,630,289 B1
(45) Date of Patent: Apr. 21, 2020

(54) ON-DIE-TERMINATION CIRCUIT AND CONTROL METHOD FOR OF THE SAME

(71) Applicant: REALTEK SEMICONDUCTOR CORP., Hsinchu (TW)

(72) Inventors: Shen-Kuo Huang, Hsinchu County (TW); Chun-Chi Yu, Hsinchu County (TW); Chih-Wei Chang, Hsinchu County (TW); Gerchih Chou, San Jose, CA (US)

(73) Assignee: REALTEK SEMICONDUCTOR CORP., Hsinchu (TW)

( * ) Notice: Subject to any disclaimer, the term of this patent is extended or adjusted under 35 U.S.C. 154(b) by 0 days.

(21) Appl. No.: 16/289,960

(22) Filed: Mar. 1, 2019

(51) Int. Cl.
*H03K 19/0175* (2006.01)
*H03K 19/00* (2006.01)

(52) U.S. Cl.
CPC ..... *H03K 19/0005* (2013.01); *H03K 19/0008* (2013.01); *H03K 19/017545* (2013.01)

(58) Field of Classification Search
CPC ........... H03K 19/0005; H03K 19/0008; H03K 19/003; H03K 19/017545; H03K 19/01825; H03K 19/018557
See application file for complete search history.

(56) References Cited

U.S. PATENT DOCUMENTS

| | | | | |
|---|---|---|---|---|
| 5,140,611 A * | 8/1992 | Jones | ...................... | H03K 7/08 332/109 |
| 6,909,305 B1 * | 6/2005 | Li | ...................... | H03K 19/0005 326/30 |
| 7,176,729 B2 * | 2/2007 | Hayashi | ............. | H03K 19/0005 326/30 |
| 7,421,631 B2 * | 9/2008 | Morioka | .......... | G01R 31/31712 326/30 |
| 7,482,833 B2 * | 1/2009 | Sreeramaneni | .... | H03K 19/0005 326/30 |
| 7,525,337 B2 * | 4/2009 | Park | ...................... | G11C 5/063 326/30 |
| 7,782,078 B2 * | 8/2010 | Koo | ...................... | G11C 5/063 326/30 |
| 7,786,752 B2 | 8/2010 | Oh et al. | | |
| 8,004,314 B2 * | 8/2011 | Kim | .................. | H03K 19/0005 326/30 |

(Continued)

FOREIGN PATENT DOCUMENTS

KR        100422451 B1      3/2004

*Primary Examiner* — Jason Crawford
(74) *Attorney, Agent, or Firm* — Li & Cai Intellectual Property (USA) Office (57) ABSTRACT

An ODT circuit is connected to a memory module and includes a first transmission line, a first ODT, a second ODT, a first switch circuit, a third ODT, a fourth ODT, a second switch circuit, and an ODT control logic. The first and second ODTs are coupled to a first node on the first transmission line. The first switch circuit includes a first switch and a second switch, and is driven according to the first control signal. The third and the fourth ODTs are coupled to a second node on the first transmission line. The second switch circuit includes a third switch and a fourth switch, and is driven according to the second control signal. The ODT control logic outputs the first control signal and the second control signal to control the first switch circuit and the second switch circuit to be turned on at different timings.

16 Claims, 6 Drawing Sheets

(56) References Cited

U.S. PATENT DOCUMENTS

| | | | | |
|---|---|---|---|---|
| 8,198,911 B2* | 6/2012 | Fujisawa | ............... | G11C 29/02 |
| | | | | 326/30 |
| 8,324,927 B2* | 12/2012 | Bhakta | ................ | G11C 7/04 |
| | | | | 326/30 |
| 8,922,240 B2* | 12/2014 | Song | ............. | H03K 19/018557 |
| | | | | 326/30 |
| 9,183,901 B2* | 11/2015 | Kim | ............... | G11C 5/063 |
| 9,432,018 B2* | 8/2016 | Park | ............... | H03K 19/0013 |
| 2003/0218477 A1* | 11/2003 | Jang | ............... | H03K 19/0005 |
| | | | | 326/30 |
| 2005/0040845 A1* | 2/2005 | Park | ............... | H03K 19/0005 |
| | | | | 326/30 |
| 2005/0242832 A1* | 11/2005 | Shin | ............... | H04L 25/0278 |
| | | | | 326/30 |
| 2007/0080707 A1* | 4/2007 | Brinkman | ............... | H01L 23/34 |
| | | | | 326/30 |
| 2007/0103189 A1* | 5/2007 | Chang | ............... | G01R 31/3172 |
| | | | | 326/30 |
| 2008/0079457 A1* | 4/2008 | Yuan | ............... | H03K 19/0005 |
| | | | | 326/30 |
| 2008/0122478 A1* | 5/2008 | Mei | ............... | G11C 7/04 |
| | | | | 326/27 |
| 2008/0315913 A1* | 12/2008 | Kim | ............... | G11C 7/1057 |
| | | | | 326/30 |
| 2009/0237109 A1* | 9/2009 | Haig | ............... | H03K 19/0005 |
| | | | | 326/30 |
| 2012/0169370 A1* | 7/2012 | Oh | ............... | H03K 19/017545 |
| | | | | 326/30 |
| 2013/0069689 A1* | 3/2013 | Song | ............... | G11C 7/1057 |
| | | | | 326/30 |
| 2017/0099050 A1* | 4/2017 | Lee | ............... | G11C 7/1057 |

* cited by examiner

ON-DIE-TERMINATION CIRCUIT AND CONTROL METHOD FOR OF THE SAME

FIELD OF THE DISCLOSURE

The present disclosure relates to an on-die-termination (ODT) circuit and a control method for the same, and more particularly to an on-die-termination (ODT) circuit and a control method for the same with a time-divisionally turning on mechanism.

BACKGROUND OF THE DISCLOSURE

The conventional Dynamic Random Access Memory (DRAM) module usually includes an on-die termination (ODT), which is used for impedance matching of signal lines and reduces signal distortion. Conventional ODTs are typically coupled to a reference voltage, such as a ground voltage. In the existing memory, when the controller performs a read operation, the ODT will be turned on first, so that voltage levels of the data signal pin DQ/DQS/DQS # of DDR3/LPDDR2/LPDDR3 stays at ½VDD, a voltage level of DDR4 stays at VDD, and a voltage level of LPDDR4 stays at VSS. When the ODT is turned on, an instantaneous current will be driven simultaneously, causing a voltage of an in-chip power supply node or a voltage of an in-chip ground node unstable.

Specifically, since a package power supply inductance exists between an external power supply node and the in-chip power supply node, and a package grounding inductance exists between an external ground node and the in-chip ground node, a voltage difference may be shown as following equations (1) and (2):

$$V-V'=Lp(di/dt) \quad \text{Eq.(1)}$$

$$G'-G=Lg(di/dt) \quad \text{Eq.(2)}$$

Where V is a voltage level of the external power supply node, V' is a voltage level of the in-chip power supply node, G is a voltage level of the external ground node, G' is a voltage level of the in-chip ground node, Lp is a package power supply inductance, Lg is a package grounding inductance, i is the current, and t is the time. As can be seen from the above, when the ODT is turned on, the voltage of the in-chip power supply node or the voltage of the in-chip ground node will be unstable due to the package power supply inductance and the package grounding inductance, which affects an operation of the memory module.

Therefore, providing a method to reduce ripple voltages of the in-chip power supply node or the in-chip ground node through the improvement of the design of the ODT circuit control mechanism, has become one of the important issues in the art.

SUMMARY OF THE DISCLOSURE

In response to the above-referenced technical inadequacies, the present disclosure provides an on-die-termination (ODT) circuit and a control method for the same.

In one aspect, the present disclosure provides an on-die-termination (ODT) circuit, which is connected to a memory module and includes a first transmission line, a first ODT, a second ODT, a first switch circuit, a third ODT, a fourth ODT, a second switch circuit, and an ODT control logic. The first transmission line is configured to transfer data between the memory module and a first pad. The first on-die-termination is coupled to a first node on the first transmission line. The second on-die-termination is coupled to the first node. The first switch is coupled between a first in-chip power supply node and the first on-die-termination, and is driven according to a first control signal. The third on-die-termination is coupled to a second node on the first transmission line. The fourth on-die-termination is coupled to the second node. The second switch circuit includes a third switch and a fourth switch, the third switch is coupled between a second in-chip power supply node and the third on-die-termination, and is driven according to a second control signal, the fourth switch is coupled between the fourth on-die-termination and a second in-chip ground node, and is driven according to the second control signal. The ODT control logic is configured to output the first control signal and the second control signal to control the first switch circuit and the second switch circuit to be turned on at different timings.

In another aspect, the present disclosure provides a control method for on-die-termination (ODT) circuit, which is applicable to a memory module, and the control method includes: providing an on-die-termination circuit connected to the memory module, the on-die-termination circuit includes a first transmission line, a first ODT, a second ODT, a first switch circuit, a third ODT, a fourth ODT, a second switch circuit, and an ODT control logic. The first transmission line is configured to transfer data between the memory module and a first pad. The first on-die-termination is coupled to a first node on the first transmission line. The second on-die-termination is coupled to the first node. The first switch is coupled between a first in-chip power supply node and the first on-die-termination, and is driven according to a first control signal. The third on-die-termination is coupled to a second node on the first transmission line. The fourth on-die-termination is coupled to the second node. The second switch circuit includes a third switch and a fourth switch, the third switch is coupled between a second in-chip power supply node and the third on-die-termination, and is driven according to a second control signal, the fourth switch is coupled between the fourth on-die-termination and a second in-chip ground node, and is driven according to the second control signal. The ODT control logic is configured to output the first control signal and the second control signal to control the first switch circuit and the second switch circuit to be turned on at different timings. The control method further includes configuring the ODT control logic to output the first control signal and the second control signal to control the first switch circuit and the second switch circuit to be turned on at different timings.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The present disclosure will become more fully understood from the following detailed description and accompanying drawings.

The present disclosure will become more fully understood from the following detailed description and accompanying drawings.

DETAILED DESCRIPTION OF THE EXEMPLARY EMBODIMENTS

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like.

The following is a description of an embodiment of the present disclosure relating to "an on-die-termination (ODT) circuit and a control method for the same", by way of specific embodiment, those skilled in the art will be able to understand the advantages and effects of the present disclosure. The disclosure can be implemented or applied in various other specific embodiments, and various modifications and changes can be made without deviate the concept of the disclosure. In addition, the drawings of the present disclosure are merely illustrative and are not intended to be stated in the actual size. The following embodiment will further explain the related technical feature of the present disclosure, but the disclosure is not limited to the present disclosure.

First Embodiment

Figure 1:
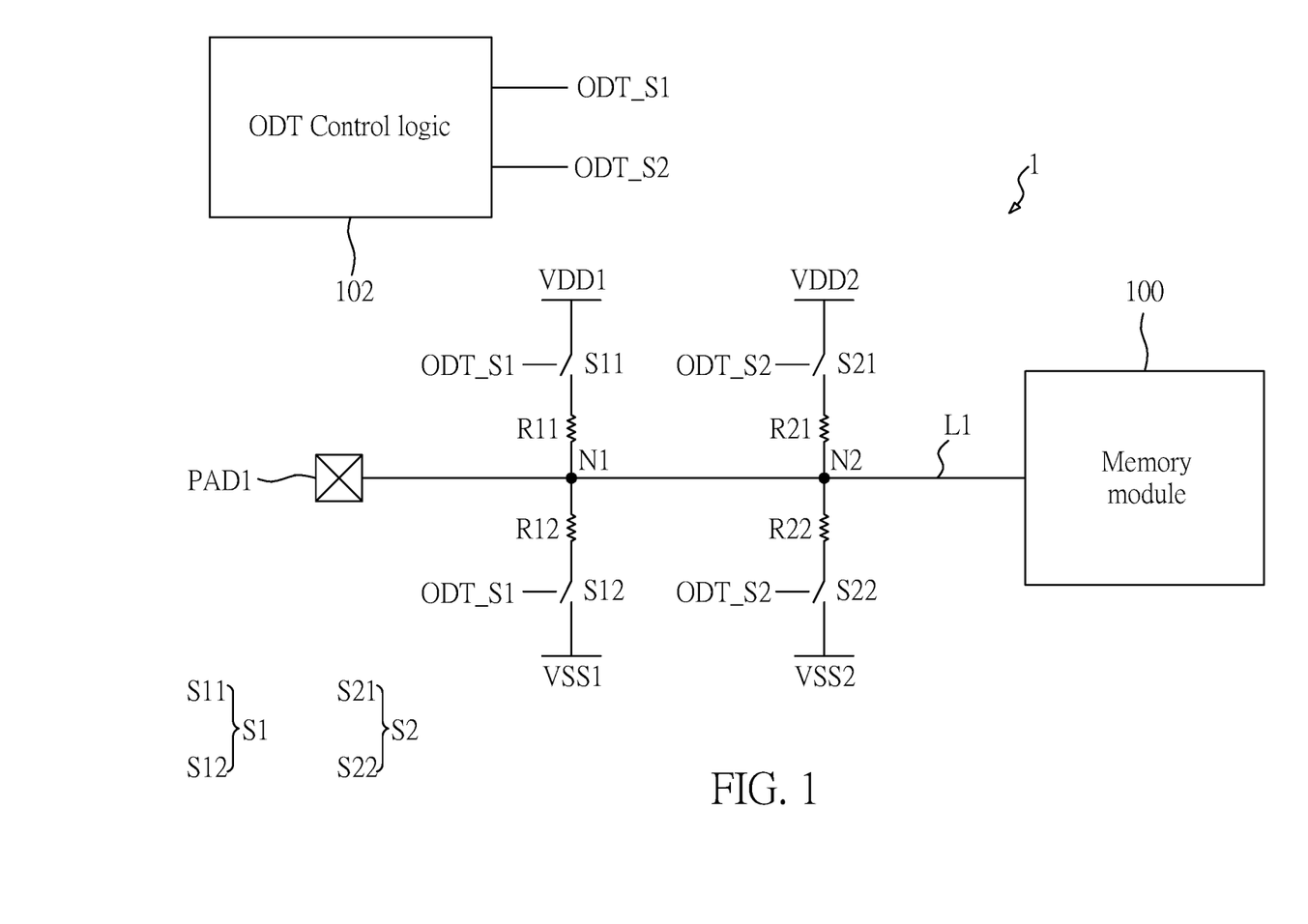
FIG. 1 is a circuit layout of an on-die-termination circuit according to a first embodiment of the present disclosure.

Reference is now made to FIG. 1, which is a circuit layout of an on-die-termination circuit according to a first embodiment of the present disclosure. The first embodiment of the present disclosure provides an on-die-termination (ODT) circuit 1 connected to a memory module 100, the ODT circuit 1 includes a first transmission line L1, a first ODT R11, a second ODT R12, a first switch circuit S1, and a third ODT R21, the fourth ODT R22, the second switch circuit S2, and an ODT control logic 102.

The first transmission line L1 is configured to transfer data between the memory module 100 and a first pad PAD1. The first on-die-termination R11 is coupled to a first node on the first transmission line. The second on-die-termination R12 is coupled to the first node N1. The first switch circuit S1 includes a first switch S11 and a second switch S12. The first switch S11 is coupled between a first in-chip power supply node VDD1 and the first ODT R11, and is driven according to the first control signal ODT_S1. The second switch S12 is coupled between the second ODT R12 and a first in-chip ground node VSS1, and is also driven according to the first control signal ODT_S1.

Preferably, the third ODT R21 is coupled to a second node N2 on the first transmission line L1. The fourth ODT R22 is coupled to the second node N2. The second switch circuit S2 includes a third switch S21 and a fourth switch S22. The third switch S21 is coupled between a second in-chip power supply node VDD2 and the third ODT R21, and is driven according to a second control signal ODT_S2. The fourth switch S22 is coupled between the fourth ODT R22 and the second in-chip ground node VSS2, and is also driven according to the second control signal ODT_S2. The first in-chip power supply node VDD1 and the second in-chip power supply node VDD2 can be connected to the same power source, and the first in-chip ground node VSS1 and the second in-chip ground node VSS2 can be connected to the same ground terminal.

In addition, the ODT circuit 1 further includes the ODT control logic 102, which is configured to output the first control signal ODT_S1 and the second control signal ODT_S2 to control the first switch circuit S1 and the second switch circuit S2 to be turned on at different timings. The first switch circuit S1 and the second switch circuit S2 can include, but are not limited to, a P-type metal oxide semiconductor field effect transistor (PMOSFET), an N-type metal oxide semiconductor field effect transistor (NMOSFET), and a transmission gate.

In detail, the ODT control logic 102 can be configured with an external ODT pin. When an ODT enable signal is applied to the external ODT pin disposed outside the memory chip, the ODT enable signal can be transmitted to the ODT control logic 102 disposed inside the memory chip. The ODT control logic 102 can generate the first control signal ODT_S1 and the second control signal ODT_S2 according to a target resistance set in an extended mode register set (EMRS). The termination resistance control logic 102 can be, or be included in, a memory controller that is a bus circuit controller used to manage and schedule transfer speeds from the memory to a processor. The memory controller can be a single chip or integrated into an associated large chip, which can be, for example, a microprocessor or a Northbridge built-in memory controller.

When the first control signal ODT_S1 and the second control signal ODT_S2 are applied, the first switch circuit S1 and the second switch circuit S2 are driven according to the logic states of the first control signal ODT_S1 and the second control signal ODT_S2, and terminates the first pad PAD1 according to a predetermined termination resistance value. Here, DQ, DQS, /DQS and other pins of the memory module 100 can be terminated. The advantage of this method is that electronic components such as terminating resistors on a motherboard can be omitted, thereby greatly reducing the manufacturing cost of the circuit board and also making the design of the motherboard more compact. Moreover, since the idle memory chip can be quickly turned on and off, the power consumption when the memory is idle is largely reduced. In addition, terminations performed from the inside of the chip will be more timely and efficient than terminations performed by the motherboard, thereby reducing the latency of the memory. This also makes it possible to further improve the operating frequency of the memory, for example, DDR2, DDR3 (L), DDR4, LPDDR2/3/4.

Figure 2:
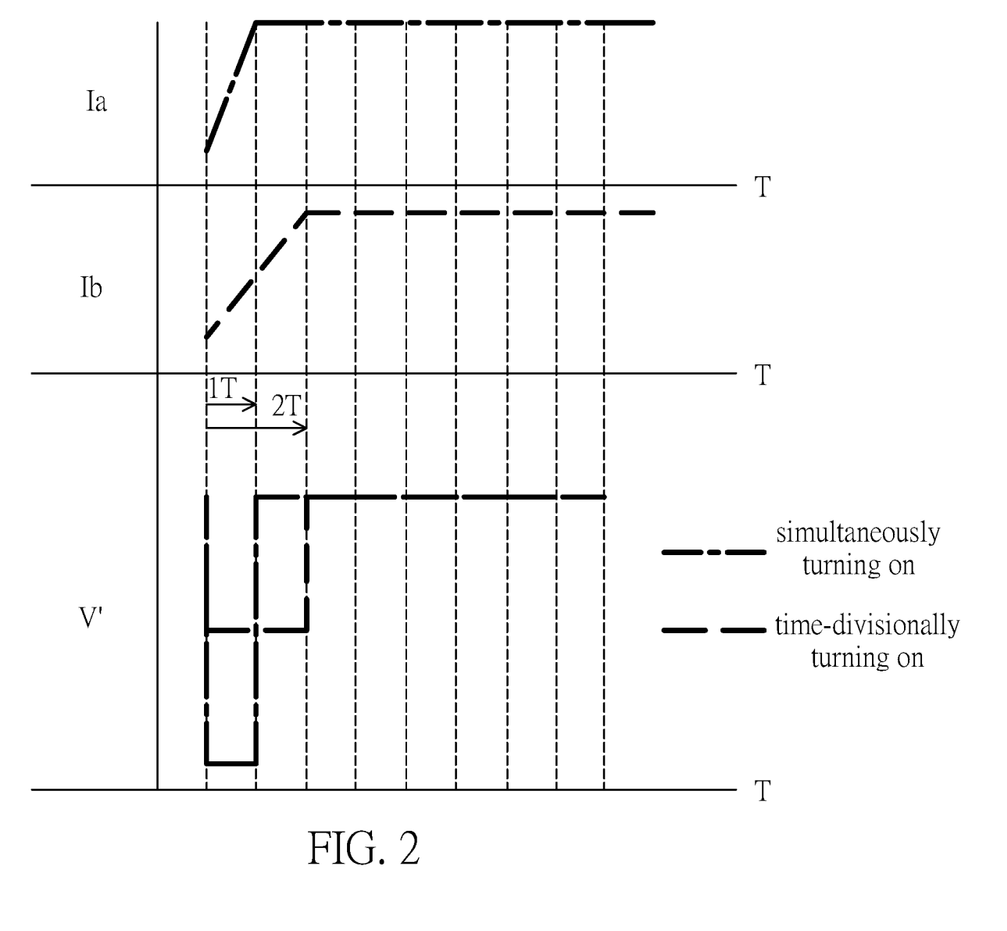
FIG. 2 is a graph showing total currents generated by simultaneously turned on and time-divisionally turned on, FIG. 3 is a circuit layout of an on-die-termination circuit according to a second embodiment of the present disclosure.

Reference is now made to FIG. 2, which is a graph showing total currents generated by simultaneously turned on and time-divisionally turned on, and voltage level of an in-chip power supply node versus time according to the first embodiment of the present disclosure. As shown, Ia represents a total current that the first switching circuit S1 and the second switching circuit S2 are simultaneously turned on in time 1T, Ib represents a total current that the first switching circuit S1 and the second switching circuit S2 are time-divisionally turned on in time 2T, and V' represents a voltage level of the in-chip power supply node. According to the above equations (1) and (2), it can be seen that when the first ODT R11, the second ODT R12, the third ODT R21, and the fourth ODT R22 are grouped and time-divisionally turned on, the di/dt value when the ODT is turned on can be reduced, and voltage ripples of the in-chip power supply node or voltage ripples of the in-chip ground node formed by L(p/g)*di/dt can be further reduced, thereby maintaining a constant voltage while data is transferring in the first transmission line L1 between the memory module 100 and the first pads PAD1. The on-time of the first switch circuit S1 and the second switch circuit S2 can be adjusted. For example, the two can be adjusted with fixed time differences or different time differences.

Second Embodiment

Figure 3:
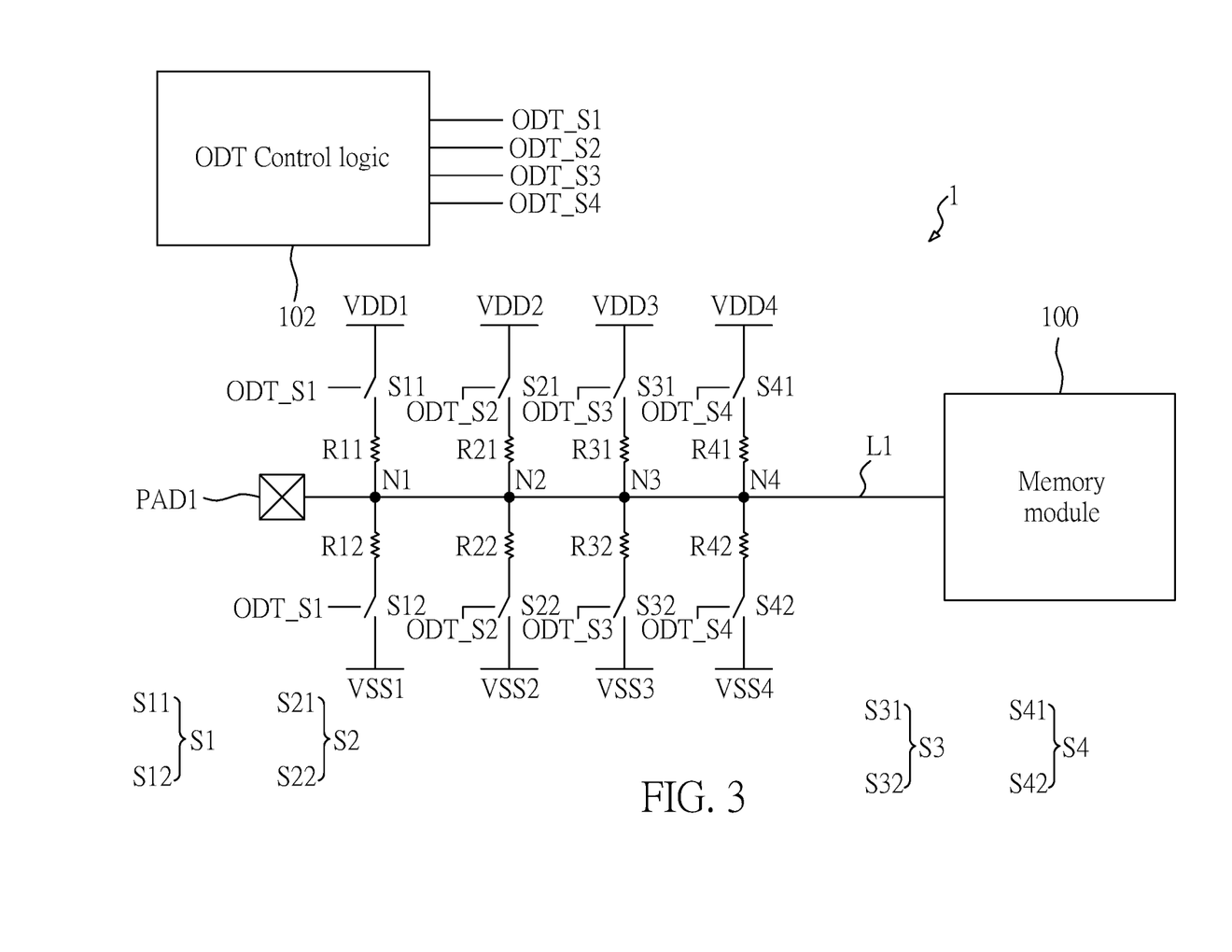

Reference is now made to FIG. 3, which is a circuit layout of an on-die-termination circuit according to a second embodiment of the present disclosure. The second embodiment of the present disclosure further provides an ODT circuit 1, which is modified based on the ODT circuit 1 of FIG. 1, and thus the repeated descriptions are omitted. In this embodiment, the ODT circuit 1 further includes a fifth resistor R31, a sixth resistor R32, a third switch circuit S3, a seventh resistor R41, an eighth resistor R42, and a fourth switch circuit S4.

Further, the fifth resistor R31 is coupled to a third node N3 on the first transmission line L1, and the sixth resistor R32 is also coupled to the third node N3. The seventh resistor R41 is coupled to a fourth node N4 on the first transmission line L1, and the eighth resistor R42 is also coupled to the fourth node.

In addition, the ODT circuit 1 further includes the third switch circuit S3 and the fourth switch circuit S4. The third switch circuit S3 includes a fifth switch S31 and a sixth switch S32. The fifth switch S31 is coupled between a third in-chip power supply node VDD3 and the fifth resistor R31, and is driven according to a third control signal ODT_S3. On the other hand, the sixth switch S32 is coupled between the sixth resistor R32 and a third in-chip ground node VSS, and is driven according to the third control signal ODT_S3.

The fourth switch circuit S4 includes a seventh switch S41 and an eighth switch S42. The seventh switch S41 is coupled between a fourth in-chip power supply node VDD4 and the seventh resistor R41, and is driven according to a fourth control signal ODT_S4, and the eighth switch S42 is coupled to the eighth resistor R42 and a fourth in-chip ground node VSS, and is also driven according to the fourth control signal ODT_S4.

The third switch circuit S3 and the fourth switch circuit S4 can include, but are not limited to, a P-type metal oxide semiconductor field effect transistor (PMOSFET), an N-type metal oxide semiconductor field effect transistor (NMOSFET), and a transmission gate.

The ODT control logic 102 is further configured to output the third control signal ODT_S3 and the fourth control signal ODT_S4. Similarly, when the third control signal ODT_S3 and the fourth control signal ODT_S4 are applied, the third switch circuit S3 and the fourth switch circuit S4 are driven according to the logic states of the third control signal ODT_S3 and the fourth control signal ODT_S4, and terminates the first pad PAD1 according to a predetermined termination resistance value. Here, DQ, DQS, /DQS and other pins of the memory module 100 can be terminated.

In this embodiment, on-time points of the first switch circuit S1, the second switch circuit S2, the third switch circuit S3, and the fourth switch circuit S4 can be operated in different groups. For example, the ODT control logic 102 can be configured to control the first switch circuit S1, the second switch circuit S2, the third switch circuit S3, and the fourth switch circuit S4 to be turned on at different timings, that is, the switch circuits are divided into four groups to be turned on.

On the other hand, the ODT control logic 102 can be configured to control the first switch circuit S1 and the third switch circuit S3 to be turned on at the same timings, and control the second switch circuit S2 and the fourth switch circuit S4 to be turned on at the same timings, that is, the switch circuits are divided into two groups to be turned on.

Figure 4:
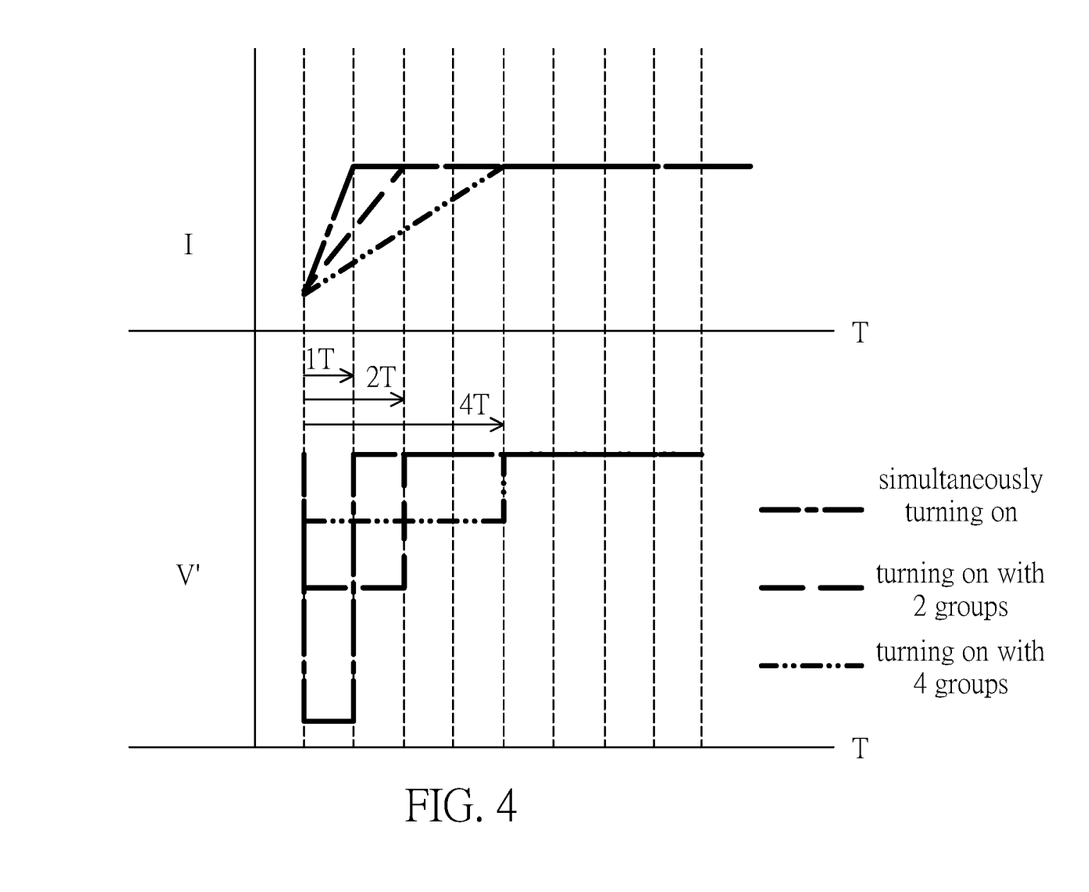
FIG. 4 is a graph showing total currents generated by simultaneously turned on and time-divisionally turned on, and voltage level of an in-chip power supply node versus time according to the second embodiment of the present disclosure.

Reference is now made to FIG. 4, which is a graph showing total currents generated by simultaneously turned on and time-divisionally turned on, and voltage level of an in-chip power supply node versus time according to the second embodiment of the present disclosure. As shown, I represents total currents under each of conditions. According to the above equations (1) and (2), it can be seen that when the ODTs are grouped and time-divisionally turned on, the di/dt value when the ODT is turned on can be reduced, and voltage ripples of the in-chip power supply node or voltage ripples of the in-chip ground node formed by L(p/g)*di/dt can be further reduced, thereby maintaining a constant voltage while data is transferring in the first transmission line L1 between the memory module 100 and the first pads PAD1.

Here, the first switch circuit S1, the second switch circuit S2, the third switch circuit S3, and the fourth switch circuit S4 can be divided into two groups or four groups, and the on-times of the first switch circuit S1, the second switch circuit S2, the third switch circuit S3 and the fourth switch circuit S4 can be adjusted, for example, they can be fixed time differences or different time differences, and, as a number of groups is larger, more time will be required to completely turn on the ODT. Therefore, the user can determine, according to the memory chip design, a required delay time and the number of groups while making reference to the package power supply inductance value between the external power supply node and the in-chip power supply node and the voltage ripple generated by the package ground inductance value between the external ground node and the in-chip ground node.

Third Embodiment

Figure 5:
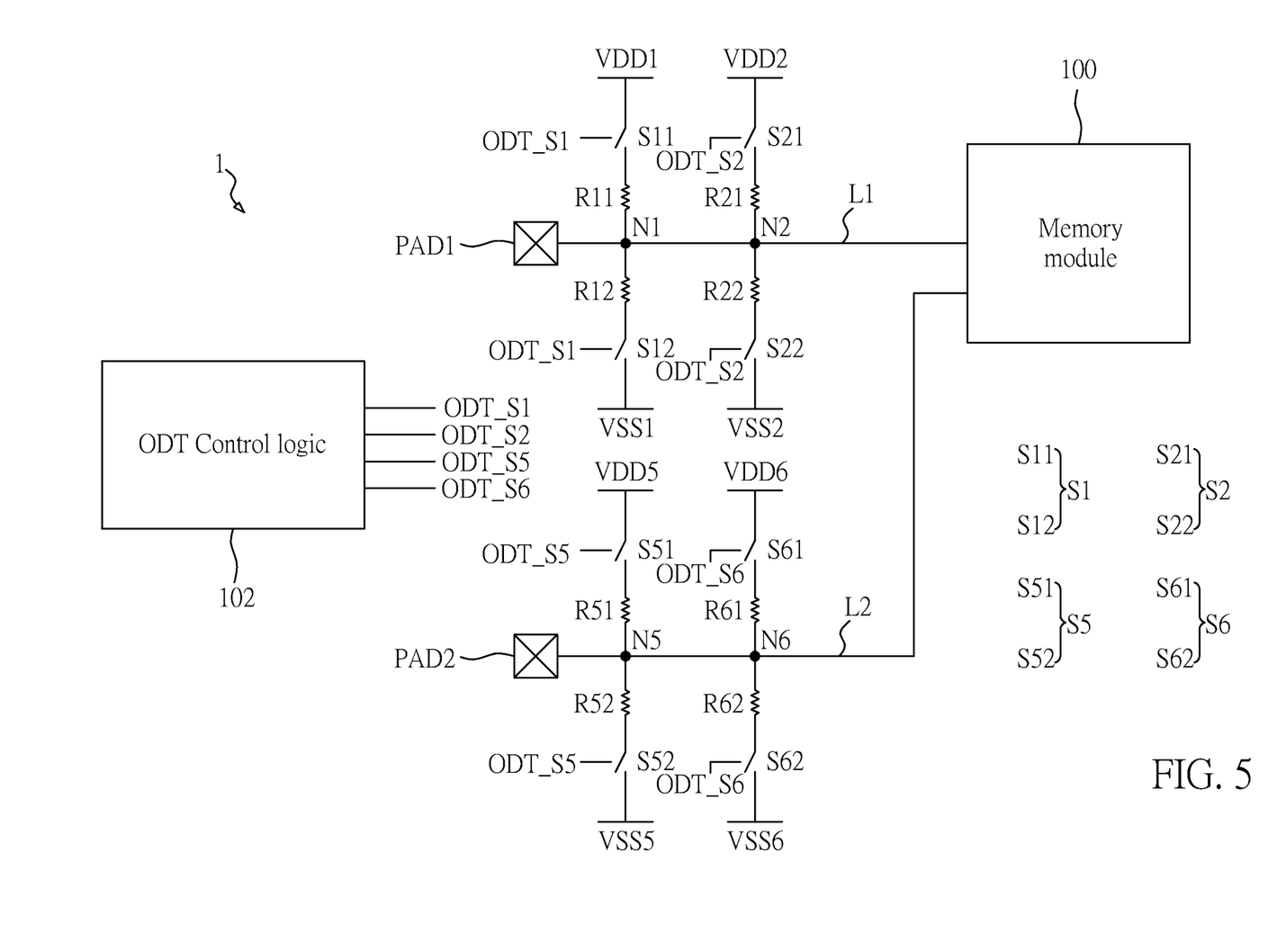
FIG. 5 is a circuit layout of an on-die-termination circuit according to a third embodiment of the present disclosure.

Reference is now made to FIG. 5, which is a circuit layout of an on-die-termination circuit according to a third embodiment of the present disclosure. The third embodiment of the present disclosure further provides an ODT circuit 1, which is modified based on the ODT circuit 1 of FIG. 1, and thus the repeated descriptions are omitted. In this embodiment, the ODT circuit 1 further includes a second transmission line L2, a ninth resistor R51, a tenth resistor R52, a fifth switch circuit S5, an eleventh resistor R61, a twelfth resistor R62, and a sixth switch circuit S6.

The second transmission line L2 is configured to transfer data between the memory module 100 and a second pad PAD2. The ninth resistor R51 is coupled to a fifth node N5 on the second transmission line L2, and the tenth resistor R52 is also coupled to the fifth node N5. The eleventh resistor R61 is coupled to a sixth node N6 on the second transmission line L2, and the twelfth resistor R62 is also coupled to the sixth node N6.

The fifth switch circuit S5 includes a ninth switch S51 and a tenth switch S52. The ninth switch S51 is coupled between a fifth in-chip power supply node VDD5 and the ninth resistor R51, and is driven according to a fifth control signal ODT_S5. The tenth switch S52 is coupled between the tenth resistor R52 and a fifth in-chip ground node VSS5, and is also driven according to the fifth control signal ODT_S5.

On the other hand, the sixth switch circuit S6 includes an eleventh switch S61 and a twelfth switch S62, and the eleventh switch S61 is coupled between a sixth in-chip power supply node VDD6 and the eleventh resistor R61, and is driven according to the sixth control signal ODT_S6. The twelfth switch S62 is coupled between the twelfth resistor R62 and a sixth in-chip ground node VSS6, and is also driven according to the sixth control signal ODT_S6.

Here, the first in-chip power supply node VDD1 and the second in-chip power supply node VDD2 can be connected to the same power source, the fifth in-chip power supply node VDD5 and the sixth in-chip power supply node VDD6 can be connected to the same power source, the first in-chip ground node VSS1 and the second in-chip ground node VSS2 can be connected to the same ground terminal, and the fifth in-chip ground node VSS5 and the sixth in-chip ground node VSS6 can be connected to the same ground terminal.

The ODT control logic 102 is further configured to output the fifth control signal ODT_S5 and the sixth control signal ODT_S6 to control the first switch circuit S1, the second switch circuit S2, the fifth switch circuit S5 and the sixth switch circuit S6 to be turned on at different timings.

The fifth switch circuit S5 and the sixth switch circuit S6 can include, but are not limited to, a P-type metal oxide semiconductor field effect transistor (PMOSFET), an N-type metal oxide semiconductor field effect transistor (NMOSFET), and a transmission gate.

Similarly, when the first control signal ODT_S1 and the second control signal ODT_S2 are applied, the first switch circuit S1 and the second switch circuit S2 are driven according to the logic states of the first control signal ODT_S1 and the second control signal ODT_S2, and terminates the first pad PAD1 according to a predetermined termination resistance value. When the fifth control signal ODT_S5 and the sixth control signal ODT_S6 are applied, the fifth switch circuit S5 and the sixth switch circuit S6 are driven according to logic states of the fifth control signal ODT_S5 and the sixth control signal ODT_S6, and terminates the second pad PAD2 according to a predetermined termination resistance value. Here, DQ, DQS, /DQS and other pins of the memory module 100 can be terminated.

According to the above equations (1) and (2), it can be seen that when the ODTs are grouped and time-divisionally turned on, the di/dt value when the ODT is turned on can be reduced, and voltage ripples of the in-chip power supply node or voltage ripples of the in-chip ground node formed by L(p/g)*di/dt can be further reduced, thereby maintaining a constant voltage while data is transferring in the first transmission line L1 between the memory module 100 and the first pads PAD1, and maintaining a constant voltage while data is transferring in the first transmission line L2 between the memory module 100 and the second pads PAD2.

It should be noted that, in each of the above embodiments, the number of ODTs connected to each transmission line is not limited to the number provided in the embodiment.

Fourth Embodiment

Figure 6:
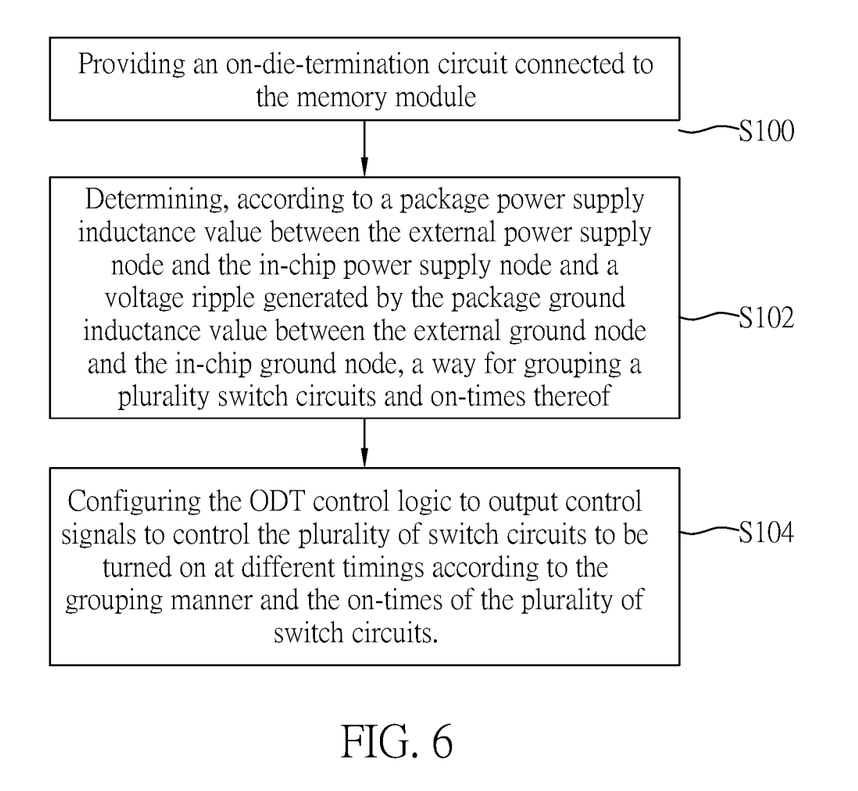
FIG. 6 is a flowchart of a control method for on-die-termination circuit according to a fourth embodiment of the present disclosure.

Reference is now made to FIG. 6, which is a flowchart of a control method for on-die-termination circuit according to a fourth embodiment of the present disclosure. The embodiment provides a control method for on-die-termination circuit, which is applicable to the above-described first to third embodiments, and is not limited to the sequence shown in the flowchart.

The control method for on-die-termination circuit of the present disclosure is applicable to a memory module, and the control method includes:

Step S100: Providing an on-die-termination circuit connected to the memory module.

In detail, the on-die-termination circuit may include the on-die-termination circuits of the above-described first to third embodiments, and thus will not be described herein.

Step S102: Determining, according to a package power supply inductance value between the external power supply node and the in-chip power supply node and a voltage ripple generated by the package ground inductance value between the external ground node and the in-chip ground node, a manner for grouping a plurality switch circuits and on-times thereof.

Step S104: Configuring the ODT control logic to output control signals to control the plurality of switch circuits to be turned on at different timings according to the grouping manner and the on-times of the plurality of switch circuits.

In conclusion, one of the beneficial effects of the present disclosure is that the ODT circuit and method for the same can reduce variation value of current versus time when the ODT is turned on, and further reduce voltage ripples of the in-chip power supply node or voltage ripples of the in-chip ground node formed by the internal power inductor and internal ground node inductor, thereby maintaining a constant voltage while data is transferring in each transmission line between the memory module and the first pad.

In addition, the plurality of switch circuits can be controlled, by dividing the switch circuits into a plurality of groups, to be turned on, and the on-time of each switch circuit can be adjusted. Users can determine, according to the memory chip design, a required delay time and the number of groups while making reference to the package power supply inductance value between the external power supply node and the in-chip power supply node and the voltage ripple generated by the package ground inductance value between the external ground node and the in-chip ground node.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. An on-die-termination (ODT) circuit connected to a memory module, comprising:
   a first transmission line configured to transfer data between the memory module and a first pad;
   a first on-die-termination coupled to a first node on the first transmission line;
   a second on-die-termination coupled to the first node;
   a first switch circuit coupled to the first transmission line and including:
      a first switch coupled between a first in-chip power supply node and the first on-die-termination, and driven according to a first control signal; and
      a second switch coupled between the second on-die-termination and a first in-chip ground node, and driven according to the first control signal;
   a third on-die-termination coupled to a second node on the first transmission line;
   a fourth on-die-termination coupled to the second node;
   a second switch circuit coupled to the first transmission line and including:
      a third switch coupled between a second in-chip power supply node and the third on-die-termination, and driven according to a second control signal; and
      a fourth switch coupled between the fourth on-die-termination and a second in-chip ground node, and driven according to the second control signal; and
   an ODT control logic configured to group the first switch circuit and the second switch circuit coupled to the first transmission line into different groups and output the first control signal and the second control signal to control the first switch circuit and the second switch circuit coupled to the first transmission line, respectively, to be time-divisionally turned on at different timings according to the different groups.

2. The ODT circuit according to claim 1, wherein the first in-chip power supply node is connected to the second in-chip power supply node, and the first in-chip ground node is connected to the second in-chip ground node.

3. The ODT circuit according to claim 1, further including:
   a fifth resistor coupled to a third node on the first transmission line;
   a sixth resistor coupled to the third node;
   a third switching circuit including:
      a fifth switch coupled between a third in-chip power supply node and the fifth resistor, and driven according to a third control signal; and
      a sixth switch coupled between the sixth resistor and a third in-chip ground node, and driven according to the third control signal;
   a seventh resistor coupled to a fourth node on the first transmission line;
   an eighth resistor coupled to the fourth node;
   a fourth switching circuit including:
      a seventh switch coupled between a fourth in-chip power supply node and the seventh resistor, and driven according to a fourth control signal; and
      an eighth switch is coupled between the eighth resistor and a fourth in-chip ground node, and is driven according to the fourth control signal,
   wherein the ODT control logic is further configured to output the third control signal and the fourth control signal.

4. The ODT circuit according to claim 3, wherein the ODT control logic is configured to control the first switch circuit, the second switch circuit, the third switch circuit, and the fourth switch circuit to be turned at different timings.

5. The ODT circuit according to claim 3, wherein the ODT control logic is configured to control the first switch circuit and the third switch circuit to be turned on at same timings, and control the second switch circuit and the fourth switch circuit to be turned at same timings.

6. The ODT circuit according to claim 3, wherein the first in-chip power supply node is connected to the second in-chip power supply node, the third in-chip power supply node and the fourth in-chip power supply node, and the first in-chip ground node is connected to the second in-chip ground node, the third in-chip ground node and the fourth in-chip ground node.

7. The ODT circuit according to claim 1, further including:
   a second transmission line configured to transfer data between the memory module and a second pad;
   a ninth resistor coupled to a fifth node on the second transmission line;
   a tenth resistor coupled to the fifth node;
   a fifth switch circuit including:
      a ninth switch coupled between a fifth in-chip power supply node and the ninth resistor, and driven according to a fifth control signal; and
      a tenth switch coupled between the tenth resistor and a fifth in-chip ground node, and driven according to the fifth control signal;
   an eleventh resistor coupled to a sixth node on the second transmission line;
   a twelfth resistor coupled to the sixth node;
   a sixth switch circuit including:
      an eleventh switch coupled between a sixth in-chip power supply node and the eleventh resistor, and is driven according to a sixth control signal; and
      a twelfth switch coupled between the twelfth resistor and a sixth in-chip ground node, and driven according to the sixth control signal,
   wherein the ODT control logic is further configured to output the fifth control signal and the sixth control signal to control the first switch circuit, the second switch circuit, the fifth switch circuit and the sixth switch circuit to be turned on at different timings.

8. The ODT circuit according to claim 7, wherein the first in-chip power supply node is connected to the second in-chip power supply node, the fifth in-chip power supply node is connected to the sixth in-chip power supply node, the first in-chip ground node is connected to the second in-chip ground node, and the fifth in-chip ground node is connected to the sixth in-chip ground node.

9. A control method for on-die-termination (ODT) circuit, applicable to a memory module, the control method comprising:
   providing an on-die-termination circuit connected to the memory module, wherein the on-die-termination circuit includes:

a first transmission line configured to transfer data between the memory module and a first pad;
a first on-die-termination coupled to a first node on the first transmission line;
a second on-die-termination coupled to the first node;
a first switch circuit coupled to the first transmission line and including:
  a first switch coupled between a first in-chip power supply node and the first on-die-termination, and driven according to a first control signal; and
  a second switch coupled between the second on-die-termination and a first in-chip ground node, and driven according to the first control signal;
a third on-die-termination coupled to a second node on the first transmission line;
a fourth on-die-termination coupled to the second node;
a second switch circuit coupled to the first transmission line and including:
  a third switch coupled between a second in-chip power supply node and the third on-die-termination, and driven according to a second control signal; and
  a fourth switch coupled between the fourth on-die-termination and a second in-chip ground node, and driven according to the second control signal;
configuring an ODT control logic to group the first switch circuit and the second switch circuit coupled to the first transmission line into different groups and output the first control signal and the second control signal to control the first switch circuit and the second switch circuit coupled to the first transmission line, respectively, to be time-divisionally turned on at different timings according to the different groups.

10. The control method for ODT circuit according to claim 9, wherein the first in-chip power supply node is connected to the second in-chip power supply node, and the first in-chip ground node is connected to the second in-chip ground node.

11. The control method for ODT circuit according to claim 9, wherein the ODT circuit further includes:
  a fifth resistor coupled to a third node on the first transmission line;
  a sixth resistor coupled to the third node;
  a third switching circuit including:
    a fifth switch coupled between a third in-chip power supply node and the fifth resistor, and driven according to a third control signal; and
    a sixth switch coupled between the sixth resistor and a third in-chip ground node, and driven according to the third control signal;
  a seventh resistor coupled to a fourth node on the first transmission line;
  an eighth resistor coupled to the fourth node;
  a fourth switching circuit including:
    a seventh switch coupled between a fourth in-chip power supply node and the seventh resistor, and driven according to a fourth control signal; and
    an eighth switch is coupled between the eighth resistor and a fourth in-chip ground node, and is driven according to the fourth control signal,
  wherein the control method further includes configuring the ODT control logic to output the third control signal and the fourth control signal.

12. The control method for ODT circuit according to claim 11, further including configuring the ODT control logic to control the first switch circuit, the second switch circuit, the third switch circuit, and the fourth switch circuit to be turned at different timings.

13. The control method for ODT circuit according to claim 11, further including configuring the ODT control logic to control the first switch circuit and the third switch circuit to be turned on at same timings, and control the second switch circuit and the fourth switch circuit to be turned at same timings.

14. The control method for ODT circuit according to claim 11, wherein the first in-chip power supply node is connected to the second in-chip power supply node, the third in-chip power supply node and the fourth in-chip power supply node, and the first in-chip ground node is connected to the second in-chip ground node, the third in-chip ground node and the fourth in-chip ground node.

15. The control method for ODT circuit according to claim 9, wherein the ODT circuit further includes:
  a second transmission line configured to transfer data between the memory module and a second pad;
  a ninth resistor coupled to a fifth node on the second transmission line;
  a tenth resistor coupled to the fifth node;
  a fifth switch circuit including:
    a ninth switch coupled between a fifth in-chip power supply node and the ninth resistor, and driven according to a fifth control signal; and
    a tenth switch coupled between the tenth resistor and a fifth in-chip ground node, and driven according to the fifth control signal;
  an eleventh resistor coupled to a sixth node on the second transmission line;
  a twelfth resistor coupled to the sixth node;
  a sixth switch circuit including:
    an eleventh switch coupled between a sixth in-chip power supply node and the eleventh resistor, and is driven according to a sixth control signal; and
    a twelfth switch coupled between the twelfth resistor and a sixth in-chip ground node, and driven according to the sixth control signal,
  wherein the control method further including configuring the ODT control logic to output the fifth control signal and the sixth control signal to control the first switch circuit, the second switch circuit, the fifth switch circuit and the sixth switch circuit to be turned on at different timings.

16. The control method for ODT circuit according to claim 15, wherein the first in-chip power supply node is connected to the second in-chip power supply node, the fifth in-chip power supply node is connected to the sixth in-chip power supply node, the first in-chip ground node is connected to the second in-chip ground node, and the fifth in-chip ground node is connected to the sixth in-chip ground node.

* * * * *